(12) United States Patent
Jang (10) Patent No.: US 9,190,127 B2
(45) Date of Patent: Nov. 17, 2015

(54) BURST LENGTH CONTROL CIRCUIT (71) Applicant: SK HYNIX INC., Icheon (KR)

(72) Inventor: Nam Kyu Jang, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/268,991

(22) Filed: May 2, 2014

(65) Prior Publication Data

US 2015/0213859 A1 Jul. 30, 2015

(30) Foreign Application Priority Data

Jan. 27, 2014 (KR) ........................ 10-2014-0009417

(51) Int. Cl.
*G11C 7/22* (2006.01)
*G11C 7/12* (2006.01)
*G11C 7/10* (2006.01)

(52) U.S. Cl.
CPC ................ *G11C 7/22* (2013.01); *G11C 7/1018* (2013.01); *G11C 7/12* (2013.01)

(58) Field of Classification Search
CPC .................................... G11C 7/22; G11C 7/12
USPC ................................ 365/194, 233.13, 233.18
See application file for complete search history.

(56) References Cited

U.S. PATENT DOCUMENTS

| 5,893,925 | A | * | 4/1999 | Sawada | G11C 7/1072 365/189.05 |
| 6,064,627 | A | * | 5/2000 | Sakurai | G11C 7/1045 365/189.011 |
| 6,108,243 | A | * | 8/2000 | Suzuki | G11C 7/1018 365/189.14 |
| 6,134,180 | A | * | 10/2000 | Kim | G11C 7/1051 365/230.02 |
| 6,356,507 | B1 | * | 3/2002 | Kaku | H04Q 9/14 365/194 |
| 6,842,391 | B2 | * | 1/2005 | Fujioka | G11C 7/1018 365/195 |
| 7,096,283 | B2 | * | 8/2006 | Roohparvar | G11C 7/1018 710/11 |
| 7,149,824 | B2 | * | 12/2006 | Johnson | G11C 7/1027 365/189.05 |
| 7,304,908 | B2 | * | 12/2007 | Suh | G11C 7/1018 365/154 |
| 7,706,195 | B2 | | 4/2010 | Lee et al. | |
| 2005/0078548 | A1 | * | 4/2005 | Kang | G11C 29/46 365/232 |
| 2007/0211556 | A1 | * | 9/2007 | Kim | G11C 7/1039 365/230.08 |
| 2008/0175071 | A1 | | 7/2008 | Lee et al. | |
| 2009/0086553 | A1 | * | 4/2009 | Lee | G11C 7/1006 365/189.08 |
| 2010/0027358 | A1 | * | 2/2010 | Lee | G11C 7/1039 365/194 |
| 2010/0157717 | A1 | * | 6/2010 | Lee | G11C 7/1027 365/230.08 |

* cited by examiner

Primary Examiner — Vu Le
Assistant Examiner — Sung Cho (57) ABSTRACT

A burst length control circuit includes a burst length input circuit that outputs a mode register burst length signal and a burst length on-the-fly signal, a burst length generator circuit that outputs a burst length signal, and a burst length adjuster that delays the burst length signal by a write latency time to produce a write burst length control signal. A selection circuit selects any one of the burst length signal and the write burst length control signal according to a write read command signal and an on-the-fly signal received from the burst length input circuit, and outputs a burst length control signal. A burst stop counter counts the burst length control signal according to an internal write command signal and an internal read command signal, and outputs a burst stop signal corresponding to a selected burst length.

18 Claims, 5 Drawing Sheets

BURST LENGTH CONTROL CIRCUIT

CROSS-REFERENCES TO RELATED APPLICATION

The present application claims priority under 35 U.S.C. §119(a) to Korean Patent Application No. 10-2014-0009417, filed on Jan. 27, 2014, in the Korean Intellectual Property Office, which is incorporated herein by reference in its entirety.

BACKGROUND

Embodiments of the present disclosure relate to a burst length control circuit and a semiconductor device including the same, and more particularly, to a technology capable of controlling a burst length in a low power semiconductor memory device.

Semiconductor memory devices have been developed with increased degrees of integration and operating speeds. To increase operating speeds, synchronous memory devices capable of operating in synchronization with an external clock have been disclosed.

First developed were single data rate (SDR) synchronous memory devices in which one bit of data is inputted or outputted through one data pin during one cycle of an external clock, in synchronization with a rising edge of the external clock.

However, SDR synchronous memory devices had insufficient speed for a system configured to perform high speed operations. Accordingly, double data rate (DDR) synchronous memory devices configured to transfer two bits of data during one cycle of a clock have been introduced.

In the DDR synchronous memory devices, a first bit and a second bit of data are consecutively inputted or outputted through each data input/output (I/O) pin, the first and second bits in synchronization with a rising edge and a falling edge of a supplied external clock, respectively. Therefore, since a bandwidth at least two times greater than the conventional SDR synchronous memory device may be realized without increasing a frequency of the external clock, a high speed operation may be correspondingly achieved.

DDR synchronous memory devices use a multi-bit prefetch scheme in which multiple bits are internally processed at a time. The multi-bit prefetch scheme refers to a scheme in which data sequentially inputted are arranged in parallel in synchronization with a data strobe signal and then the parallelized multi-bit data are simultaneously stored in a memory cell array by a write command which is inputted in synchronization with an external clock signal.

DDR synchronous memory devices may include a plus mode capable of supporting two concurrent operations in different bank groups. If a DDR synchronous memory device enters the plus mode, when considering DDR3, write/read operations may be initiated that use two clock cycles during the plus mode, in contrast to four clock cycles used by analogous operations during a normal (non-plus) mode.

The plus mode may be used in an on-the-fly mode. An on-the-fly mode is a mode for determining whether to use a first burst length (e.g., BL4) or a second burst length (e.g., BL8) according to a bit in an address of a write or read command.

As prescribed in the JEDEC DDR3 standard, in order to utilize all cells in memory banks in a first burst length BL4 or an on-the-fly mode operation, banks are generally divided into two bank groups, e.g., first and second bank groups, and an operation for selecting whether to write data in the first or the second bank group is performed.

When a memory device is operating in a normal on-the-fly mode, an operation using four clock cycles is performed, and an address change is performed during four clock cycles. When operating in a plus on-the-fly mode, because an operation in a single clock cycle is required, an address toggle associated with the on-the-fly operation may be performed.

A conventional product under Low Power DDR3 (LP-DDR3) may adopt a burst length chop scheme in which a burst length BL×2 mode is modified to have the timing of a burst length BL×1 mode by a burst stop termination (BST) command.

However, in the burst stop termination (BST) scheme, a received command signal may be counted, which may be inconvenient. For example, in order to realize a burst length BL16 in a burst length BL32 mode, a burst stop termination command may be counted.

Further, in the related art, if a burst stop termination signal is received by a write control unit and a read control unit, the magnitude of a burst length is changed according to strobe signals of the write control unit and the read control unit. As a result, an auto-precharge mode is disabled when using the conventional burst stop termination (BST) scheme.

SUMMARY

Embodiments of the present disclosure are capable of selectively controlling a burst length in an on-the-fly mode according to a write command or a read command under low power supply voltage circumstances without receiving a burst stop termination command signal.

In an embodiment of the present disclosure, a burst length control circuit includes a burst length input circuit configured to output a mode register burst length signal including burst length information and a burst length on-the-fly signal including on-the-fly information, according to command addresses. A burst length generator circuit is configured to output a burst length signal including burst information, according to the mode register write command signal and the burst length on-the-fly signal, and a burst length adjuster is configured to control the burst length signal by a write latency time in a write mode, and output a write burst length control signal. A selection circuit is configured to select any one of the burst length signal and the write burst length control signal according to a write read command signal and an on-the-fly signal received from the burst length input circuit, and output a burst length control signal. A burst stop counter is configured to count the burst length control signal according to an internal write command signal and an internal read command signal, and output a burst stop signal corresponding to a selected burst length.

In an embodiment of the present disclosure, a semiconductor device includes a burst length control circuit configured to generate a burst length signal including burst information, output a write burst length control signal which is generated by introducing a write latency into the burst length signal, and output a burst stop signal by selecting any one of the burst length signal and the write burst length control signal according to a write read command signal, in an on-the-fly mode. The semiconductor device further includes a precharge control circuit configured to control an auto precharge operation in accordance with the burst stop signal, a write control circuit configured to control a write operation according to the burst stop signal, a read control circuit configured to control a read operation according to the burst stop signal, and a bank configured to operate according to a burst length selected according to outputs of the precharge control circuit, the write control circuit, and the read control circuit.

BRIEF DESCRIPTION OF THE DRAWINGS

Features, aspects, and embodiments of the present disclosure are described in conjunction with the attached drawings, in which.

DETAILED DESCRIPTION

Hereinafter, embodiments of a burst length control circuit and a semiconductor device including the same according to the present disclosure will be described with reference to the accompanying drawings.

Figure 1:
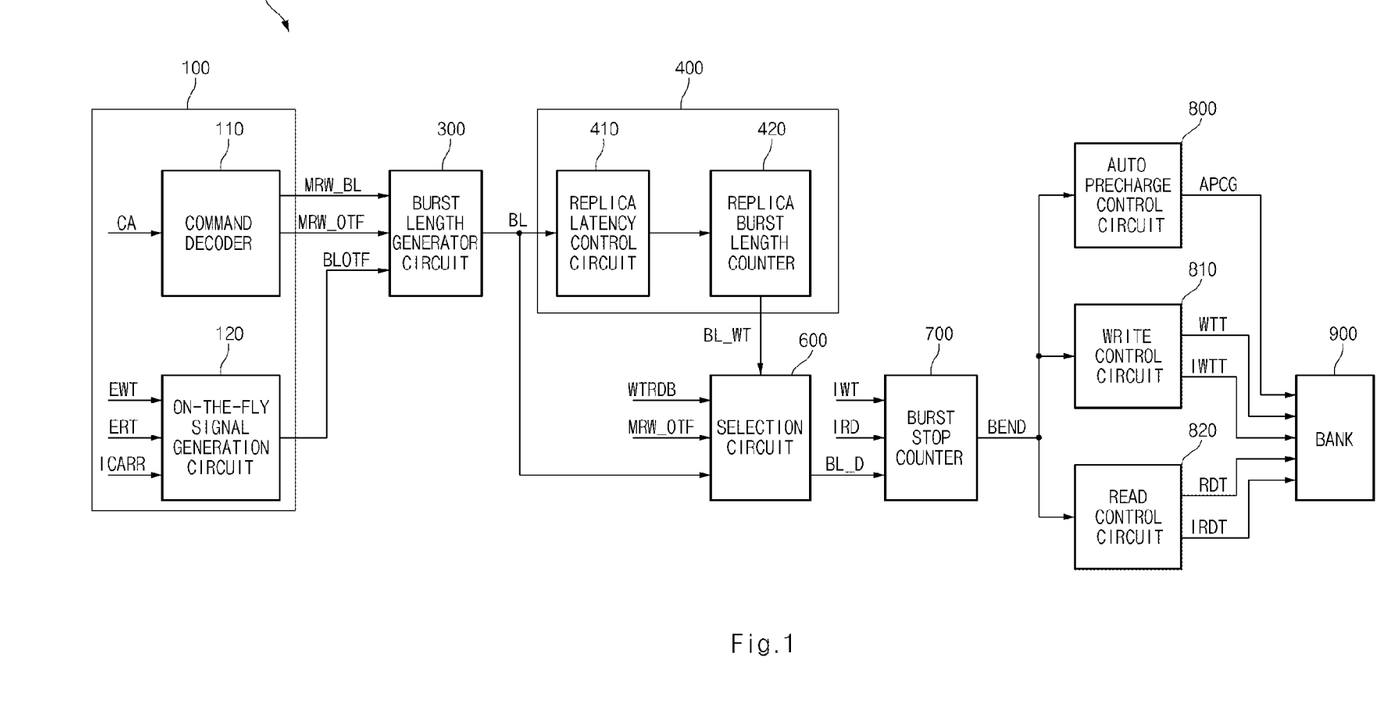
FIG. 1 shows a burst length control circuit according to an embodiment of the present disclosure.

FIG. 1 illustrates a configuration diagram of a burst length control circuit 10 in accordance with an embodiment of the present disclosure. The burst length control circuit 10 includes a burst length input circuit 100, a burst length generator circuit 300, a burst length adjuster 400, a selection circuit 600, a burst stop counter 700, an auto precharge control circuit 800, a write control circuit 810, and a read control circuit 820.

The burst length adjuster 400 includes a replica latency control circuit 410 and a replica burst length counter 420. The burst length input circuit 100 includes a command decoder 110 and an on-the-fly signal generation circuit 120.

The burst length input circuit 100 outputs a mode register burst length signal MRW_BL, an on-the-fly signal MRW_OTF, and a burst length on-the-fly signal BLOTF, which include on-the-fly information and burst length information, according to one or more command addresses CA, a write command signal EWT, a read command signal ERT, and an internal command address ICARR.

The command decoder 110 decodes the one or more command addresses CA including a mode register write command that includes the burst length information and the on-the-fly information, and outputs the mode register burst length signal MRW_BL including the burst length information and the on-the-fly signal MRW_OTF including the on-the-fly information, to the burst length generator circuit 300.

In a JEDEC specification for a DDR synchronous memory device, it is prescribed that a test be performed by entering a test mode through receiving a mode register write command MRW so as to test whether a DDR memory device operates appropriately.

Thus, in the command decoder 110, burst length and burst length on-the-fly modes are set in a mode register set. In an embodiment, the command decoder 110 includes information on a fixed burst length BL16 mode, a fixed burst length BL32 mode, and a burst length on-the-fly mode, as the burst length information, in the mode register set.

In an embodiment, the command decoder 110 outputs the mode register burst length signal MRW_BL to a high level when the fixed burst length BL16 mode is selected in the mode register set, and outputs the mode register burst length signal MRW_BL to a low level when the fixed burst length BL32 mode is selected in the mode register set.

The on-the-fly signal MRW_OTF indicates whether an on-the-fly mode is selected in the mode register set of the command decoder 110 according to the mode register write command. For example, if a specific address of the command addresses CA includes a designated bit having a low level, it represents that the burst length BL16 mode is selected in the on-the-fly mode, and if a specific address of the command addresses CA includes the designated bit having a high level, it represents that the burst length BL32 mode is selected in the on-the-fly mode.

That is to say, when the on-the-fly mode is set, a burst length is not determined by the mode register set, and instead, the burst length is determined according to whether the value of a specific address bit in the command address CA is a low level or a high level when a read command or a write command is received.

The on-the-fly signal generation circuit 120 generates the burst length on-the-fly signal BLOTF based on the write command signal EWT, the read command signal ERT, and the internal command address ICARR, and outputs the burst length on-the-fly signal BLOTF to the burst length generator circuit 300. The internal command address ICARR corresponds to the specific address bit of the command address CA used for selecting the burst length in the on-the-fly mode.

Therefore, when the burst length on-the-fly signal BLOTF is activated to a high level in accordance with the internal command address ICARR, an operation may be performed by selecting the burst length BL16 mode. Otherwise, the operation may be performed by selecting the burst length BL32 mode.

The burst length generator circuit 300 receives the mode register burst length signal MRW_BL, the on-the-fly signal MRW_OTF, and the burst length on-the-fly signal BLOTF, and outputs a burst length signal BL to the burst length adjuster 400 and the selection circuit 600. In an embodiment, the burst length signal BL is set to a predetermined value for a duration determined according to a burst length.

The burst length adjuster 400 receives the burst length signal BL and outputs a write burst length control signal BL_WT which may have the predetermined value asserted for at least twice as long. To this end, the replica latency control circuit 410 receives the burst length signal BL, delays the burst length signal BL according to a write latency of a write operation, and outputs a resultant signal to the replica burst length counter 420. In other words, the replica latency control circuit 410 delays the burst length signal BL by the write latency of the write operation.

The replica burst length counter 420 counts the duration of the output signal of the replica latency control circuit 410 to determine a magnitude of a corresponding burst length. Namely, the replica burst length counter 420 counts a burst length signal to which the write latency of the write operation has been applied, and outputs the write burst length control signal BL_WT to the selection circuit 600.

In an embodiment, the burst length generator circuit 300 generates the burst length signal BL for performing the basic burst length BL16 mode, and the burst stop counter 700 performs the burst length BL32 mode by twice performing a counting operation according to the burst length signal BL.

In an embodiment described herein, an on-the-fly mode allows selection of a burst length of either BL16 or BL32 for each data write operation and each data read operation. However, embodiments are not limited thereto, and the allowable magnitudes of the burst length may be changed.

The selection circuit 600 selects the burst length signal BL or the write burst length control signal BL_WT in response to a write read command signal WTRDB and the on-the-fly signal MRW_OTF, and outputs a burst length control signal BL_D.

The selection circuit 600 may select the magnitude of a burst length according to the write read command signal WTRDB and the on-the-fly signal MRW_OTF. The selection circuit 600 may determine whether a write operation or a read operation is to be performed using the write read command signal WTRDB.

In an embodiment, a read operation may be indicated when the write read command signal WTRDB is a low level, and a write operation may be indicated when the write read command signal WTRDB is a high level. The selection circuit 600 selects the magnitude of a burst length in the on-the-fly mode when the on-the-fly signal MRW_OTF is activated, and outputs the burst length control signal BL_D. That is, when the on-the-fly mode is active and a write operation is performed, the write burst length control signal BL_WT is used to generate the burst length control signal BL_D. Otherwise, i.e., when the on-the-fly mode is active and a read operation is performed, the burst length BL is used to generate the burst length control signal BL_D.

In other words, in the on-the-fly mode, the burst length signal BL may be selected when the write read command signal WTRDB indicates a read operation, and the write burst length control signal BL_WT which has a delayed latency magnitude may be selected when the write read command signal WTRDB indicates a write operation.

The burst stop counter 700 counts the burst length control signal BL_D in response to an internal write command signal IWT and an internal read command signal IRD, and outputs a burst stop signal BEND. The internal write command signal IWT and the internal read command signal IRD are command signals which are internally generated from the external write command signal EWT and the external read command signal ERT. The internal write command signal IWT and the internal read command signal IRD may be synchronized with high and low levels of the write read command signal WTRDB, respectively.

In an embodiment, when in the burst length BL16 mode such that the burst length control signal BL_D is a high level, the burst stop counter 700 may operate a counter for 1 cycle before generating the burst stop signal BEND. When in the burst length BL32 mode such that the burst length control signal BL_D is a low level, the burst stop counter 700 may operate a counter for 2 cycles before generating the burst stop signal BEND.

In other words, in an embodiment of the present disclosure, the burst stop signal BEND includes burst select information depending on the burst length control signal BL_D received from the selection circuit 600. The burst stop signal BEND is provided to the auto precharge control circuit 800, the write control circuit 810, and the read control circuit 820.

The auto precharge control circuit 800 generates an auto precharge signal APCG which is to be provided to a bank 900, according to the burst stop signal BEND. According to an embodiment of the present disclosure, the burst length is selected and inputted into the auto pre-charge control circuit (800) prior to the operation of the burst stop counter (700) so that the burst stop termination (BST) scheme can be used in the auto pre-charge mode.

The write control circuit 810 controls a column address strobe pulse according to the burst stop signal BEND and outputs a write signal WTT or a write signal IWTT to the bank 900 in a write operation.

The write control circuit 810 controls the write operation of the bank 900 in response to the write signal WTT in the case of the burst length BL16 mode corresponding to the burst stop signal BEND, and controls the write operation of the bank 900 in response to the write signal IWTT in the case of the burst length BL32 mode. The bank 900 writes data of a corresponding burst length which is present on a global input/output (I/O) line into storage cells of the bank 900, in response to the write signal WTT or the write signal IWTT.

The read control circuit 820 outputs a read signal RDT according to the burst stop signal BEND to the bank 900. The read signal RDT controls a column address strobe pulse of the bank 900. The read control circuit 820 controls the read operation of the bank 900 according to the read signal RDT when in the burst length BL16 mode, and controls the read operation of the bank 900 according to a read signal IRDT when in the burst length BL32 mode.

In the embodiment of the present disclosure, a burst length is differently controlled and the burst stop signal BEND is generated, in a write operation or a read operation under the on-the-fly mode. Namely, in order to support the burst length on-the-fly mode, the stop time of the burst length stop signal BEND is differently controlled when a write command is performed as compared to when a read command is performed.

In the write operation, the burst stop signal BEND delayed by a latency is generated by the burst stop counter 700 using the write burst length control signal BL_WT generated using the replica latency control circuit 410 and the replica burst length counter 420. In the read operation, the magnitude of the burst length signal BL is determined in proper synchronization with the received command, and thus, it is not necessary to introduce a latency in the read operation.

As a consequence, in the embodiment of the present disclosure, in a write operation or a read operation, the auto precharge control circuit 800, the write control circuit 810 and the read control circuit 820 operate according to the burst stop signal BEND in conformity with a set burst length mode.

Furthermore, in the embodiment of the present disclosure, since the burst stop signal BEND includes burst length select information, the auto precharge control circuit 800 may control an auto precharge operation during the burst length on-the-fly mode.

In an embodiment, bank 900 includes one or more memory arrays, each array comprising a plurality of memory cells arranged in rows and columns. The memory cells in the bank 900 may include any of dynamic memory cells, static memory cells, resistive memory cells, flash memory cells, and so on.

In an embodiment, a semiconductor device includes a plurality of banks 900, and a plurality of corresponding burst length control circuits 10. A first bank 900 and a corresponding first burst length control circuit 10 may be capable of performing burst read and write operations in an on-the-fly mode independently and concurrently with a second bank 900 and a corresponding second burst length control circuit 10.

Figure 2:
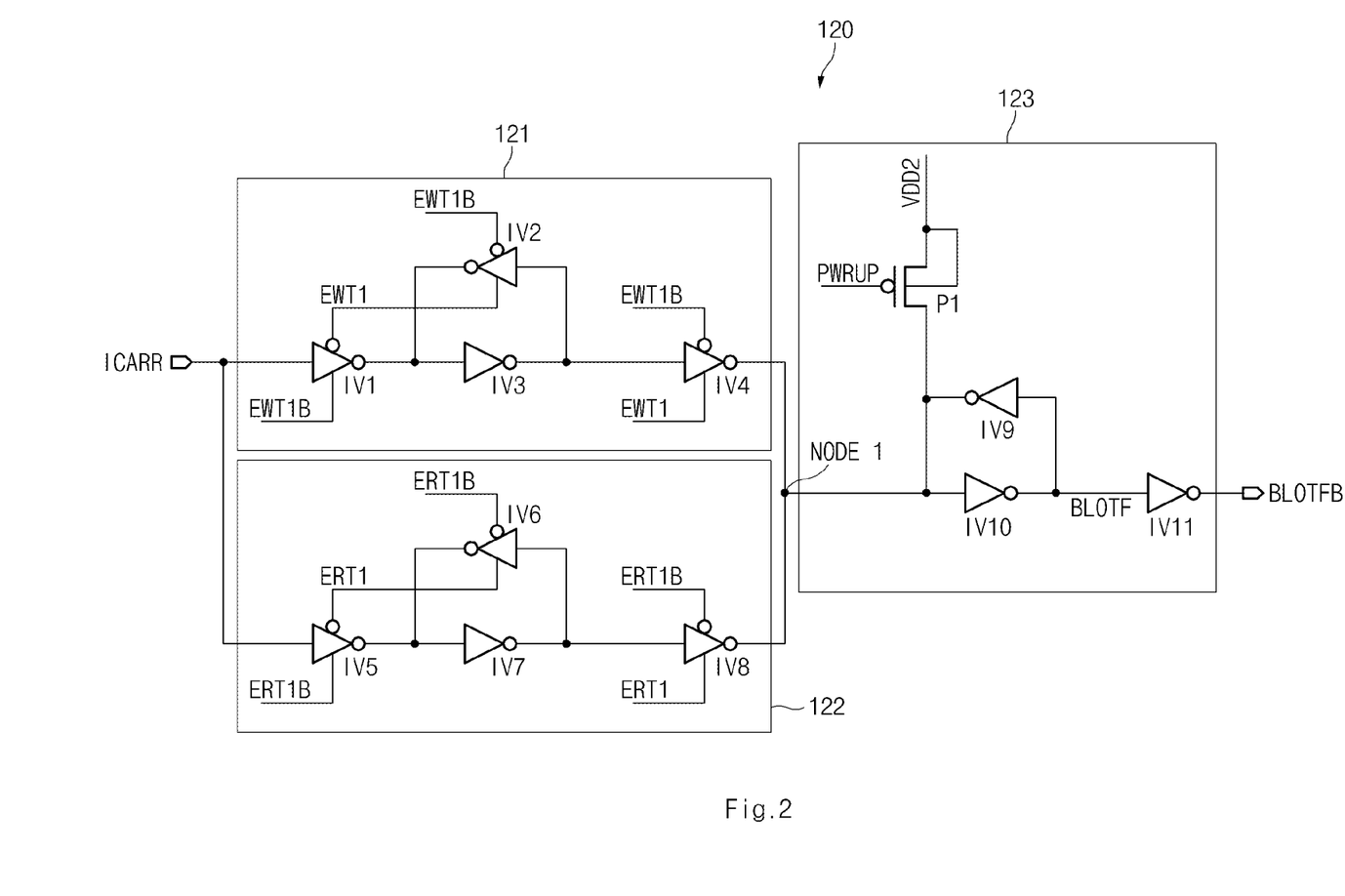
FIG. 2 shows an on-the-fly signal generation circuit according to an embodiment.

FIG. 2 illustrates a diagram of the on-the-fly signal generation circuit 120 according to an embodiment suitable for use in the burst length control circuit 10 shown in FIG. 1.

The on-the-fly signal generation circuit 120 includes a write driving section 121, a read driving section 122, and an output section 123.

The write driving section 121 latches the internal command address ICARR according to write command signals EWT1 and EWT1B in a write operation, and outputs a resultant signal to a node NODE1 when the write command signal EWT1 has a high value. The write command signal EWT1 is an inverted signal of the write command signal EWT1B.

The write driving section 121 includes first through fourth inverters IV1 through IV4. The first inverter IV1 drives the internal command address ICARR according to the write command signals EWT1 and EWT1B. The second and third inverters IV2 and IV3 are connected in a latch structure and latch the output signal of the first inverter IV1 according to the write command signals EWT1 and EWT1B. The fourth inverter IV4 drives the output signal of the inverter IV3 according to the write command signals EWT1 and EWT1B, and outputs a resultant signal to the node NODE1.

The read driving section 122 latches the internal command address ICARR according to read command signals ERT1 and ERT1B in a read operation, and outputs a resultant signal to the node NODE1 when the read command signal ERT1 has a high value. The read command signal ERT1 is an inverted signal of the read command signal ERT1B.

The read driving section 122 includes fifth through eighth inverters IV5 through IV8. The fifth inverter IV5 drives the internal command address ICARR according to the read command signals ERT1 and ERT1B. The sixth and seventh inverters IV6 and IV7 are connected in a latch structure and latch the output signal of the fifth inverter IV5 according to the read command signals ERT1 and ERT1B. The eighth inverter IV8 drives the output signal of the seventh inverter IV7 according to the read command signals ERT1 and ERT1B, and outputs a resultant signal to the node NODE1.

The output section 123 latches the signal driven to the node NODE1, and outputs the burst length on-the-fly signal BLOTF. The output section 123 includes a PMOS transistor P1 and ninth through eleventh inverters IV9 through IV11.

In the output section 123, when a power-up signal PWRUP becomes a low level in a power-up mode, the PMOS transistor P1 is turned on and pull-up drives the node NODE1 to the level of a power supply voltage VDD2. The ninth and tenth inverters IV9 and IV10 are connected in a latch structure, and latch the output signal of the node NODE1 during periods of time when a signal is not being driven to the node NODE1, and output the burst length on-the-fly signal BLOTF.

The eleventh inverter IV11 inverts and drives the burst length on-the-fly signal BLOTF, and outputs an inverted burst length on-the-fly signal BLOTFB. The burst length on-the-fly signal BLOTFB is an inverted signal of the burst length on-the-fly signal BLOTF.

Figure 3:
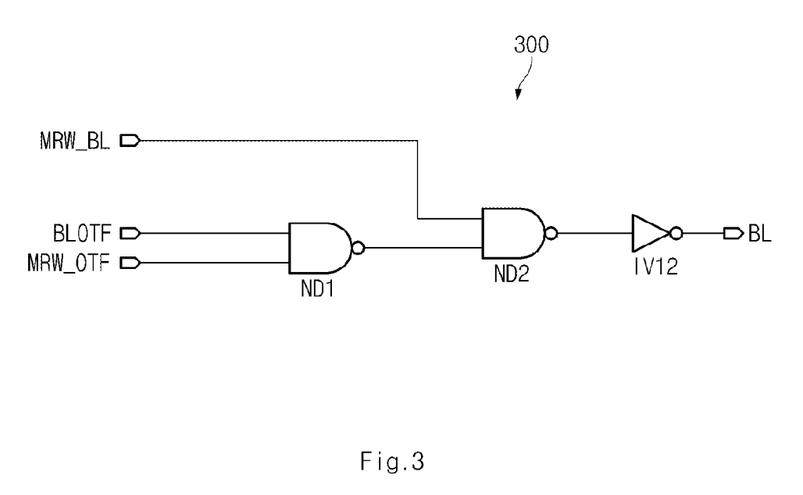
FIG. 3 shows a burst length control circuit according to an embodiment.

FIG. 3 illustrates a diagram of the burst length generator circuit 300 according to an embodiment suitable for use in the burst length control circuit 10 shown in FIG. 1.

The burst length generator circuit 300 includes first and second NAND gates ND1 and ND2 and an inverter IV12. The burst length generator circuit 300 logically combines the mode register burst length signal MRW_BL, the on-the-fly signal MRW_OTF, and the burst length on-the-fly signal BLOTF, and outputs the burst length signal BL.

The first NAND gate ND1 performs a NAND operation (that is, performs a logical AND operation on its inputs and then inverts the result) on the on-the-fly signal MRW_OTF and the burst length on-the-fly signal BLOTF. The second NAND gate ND2 performs a NAND operation on the mode register burst length signal MRW_BL and the output of the first NAND gate ND1. The inverter IV12 inverts and drives the signal produced by the second NAND gate ND2 and outputs the burst length signal BL.

The burst length generator circuit 300 configured as mentioned above combines the burst length on-the-fly signal BLOTF and the on-the-fly signal MRW_OTF of the command decoder 110, and sets the on-the-fly mode. That is to say, when in the normal operation state, wherein the on-the-fly signal MRW_OTF has a low level, the burst length signal BL is controlled according to the level of the mode register burst length signal MRW_BL. Conversely, in the on-the-fly mode, wherein the on-the-fly signal MRW_OTF has a high level and the mode register burst length signal MRW_BL has a high level, the burst length signal BL is controlled according to the burst length on-the-fly signal BLOTF.

Figure 4:
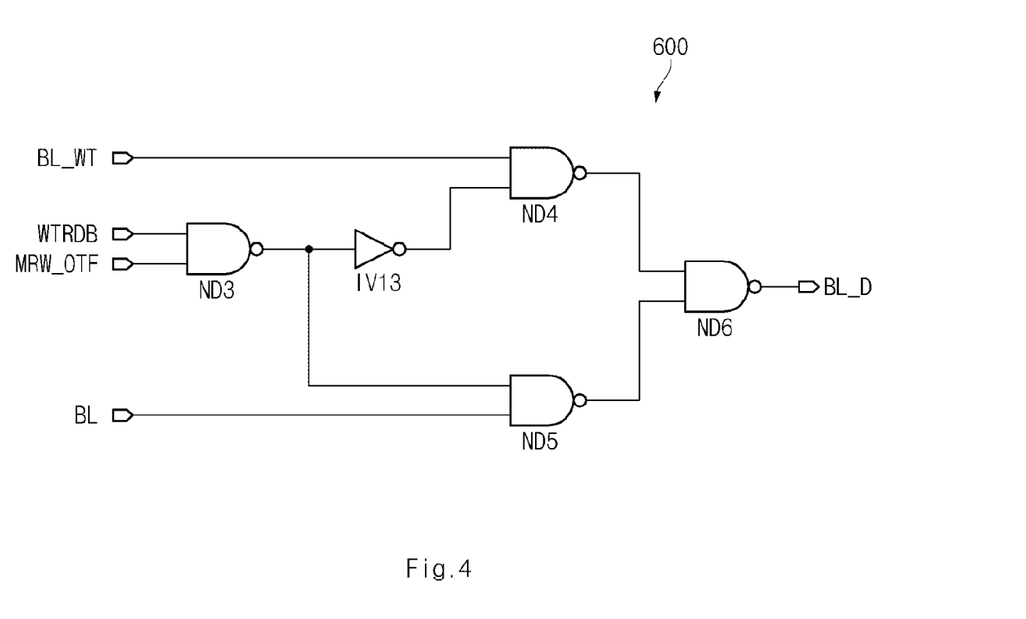
FIG. 4 shows a selection circuit according to an embodiment.

FIG. 4 illustrates a diagram of the selection circuit 600 according to an embodiment suitable for use in the burst length control circuit 10 shown in FIG. 1.

The selection circuit 600 includes third through sixth NAND gates ND3 through ND6 and an inverter IV13. The selection circuit 600 selects the burst length signal BL or the write burst length control signal BL_WT according to the write read command signal WTRDB and the on-the-fly signal MRW_OTF, and outputs the burst length control signal BL_D.

The third NAND gate ND3 performs a NAND operation on the write read command signal WTRDB and the on-the-fly signal MRW_OTF. The fourth NAND gate ND4 performs a NAND operation on the write burst length control signal BL_WT and the output of the inverter IV13 that is obtained by inverting the output of the third NAND gate ND3. The fifth NAND gate ND5 performs a NAND operation on the output of the third NAND gate ND3 and the burst length signal BL. The sixth NAND gate ND6 performs a NAND operation on the output of the fourth NAND gate ND4 and the output of the fifth NAND gate ND5, and outputs the burst length control signal BL_D. In an embodiment, the selection circuit 600 operates as a multiplexer that selects the write burst length control signal BL_WT when both the write read command signal WTRDB and the on-the-fly signal MRW_OTF have a high level, and otherwise selects the burst length signal BL.

The selection circuit 600 configured as mentioned above combines the write read command signal WTRDB and the on-the-fly signal MRW_OTF, such that when the write read command signal WTRDB has a low level indicating a read operation or the on-the-fly signal MRW_OTF has a low level indicating a normal mode, the selection circuit 600 selects the burst length signal BL to output as the burst length control signal BL_D.

Conversely, the selection circuit 600 selects the write burst length control signal BL_WT, which is generated by being delayed using a latency having a predetermined magnitude, to output as the burst length control signal BL_D when the write read command signal WTRDB has a high level indicating a write operation and the on-the-fly signal MRW_OTF has a high level indicating an on-the-fly mode.

Figure 5:
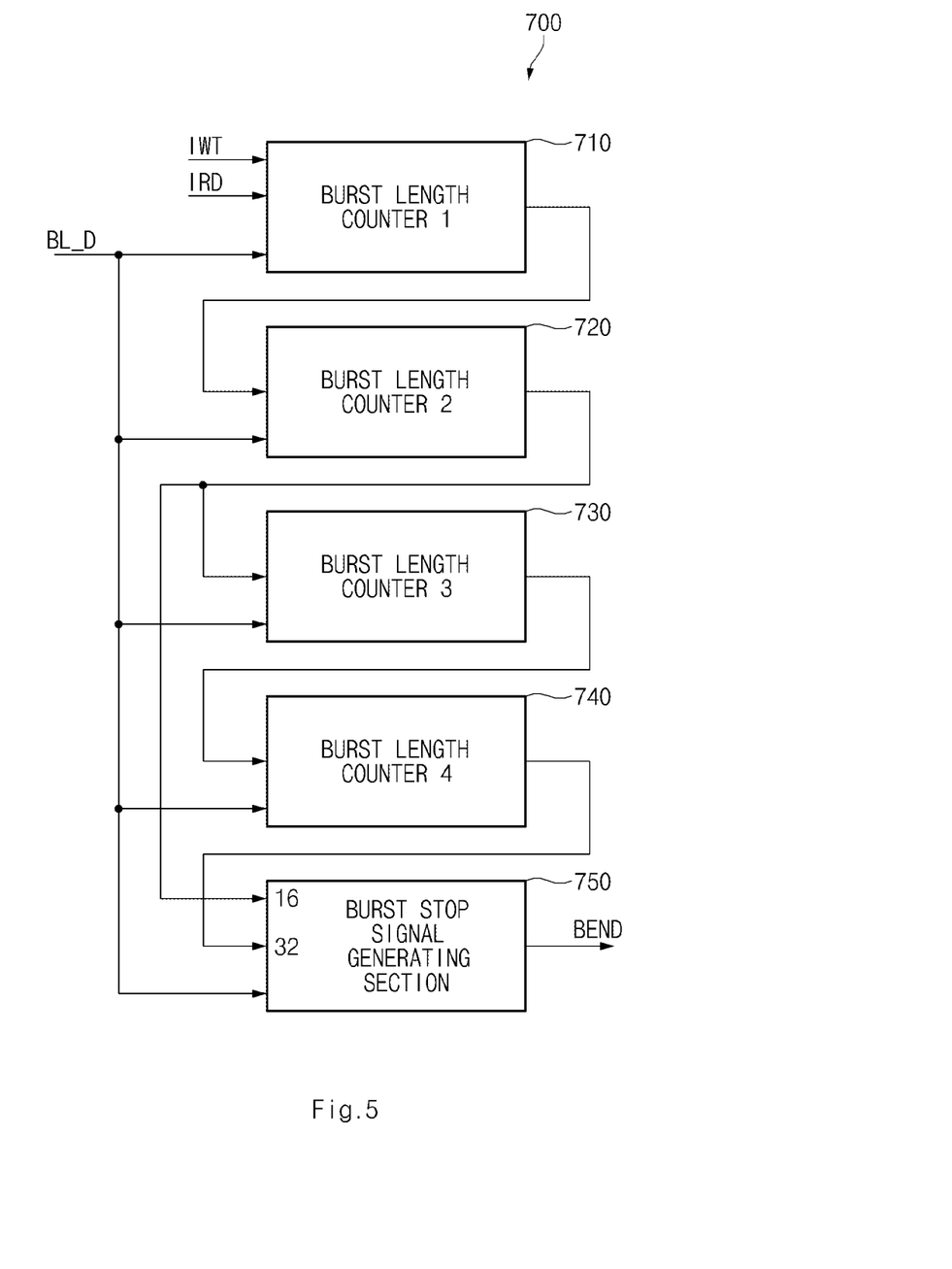
FIG. 5 shows a burst stop counter according to an embodiment.

FIG. 5 illustrates a diagram of the burst stop counter 700 according to an embodiment suitable for use in the burst length control circuit 10 shown in FIG. 1.

The burst stop counter 700 counts the burst length control signal BL_D according to the internal write command signal IWT and the internal read command signal IRD, and outputs the burst stop signal BEND. The burst stop counter 700 includes first through fourth burst length counters 710 through 740 and a burst stop signal generating section 750.

The first burst length counter 710 counts the burst length control signal BL_D according to the internal write command signal IWT and the internal read command signal IRD. The first burst length counter 710 performs a counting operation in the case where at least any one of the internal write command signal IWT and the internal read command signal IRD has a value indicating an active state. The second burst length counter 720 counts the burst length control signal BL_D according to the output of the first burst length counter 710.

The third burst length counter 730 counts the burst length control signal BL_D according to the output of the second burst length counter 720. The fourth burst length counter 740 counts the burst length control signal BL_D according to the output of the third burst length counter 730.

The burst stop signal generating section 750 selects one of the output of the second burst length counter 720 and the output of the fourth burst length counter 740 according to the burst length control signal BL_D, and outputs the selected signal as a burst stop signal BEND.

In other words, the first burst length counter 710 and the second burst length counter 720 are first group counters which operate for a 1 cycle period when a burst length magnitude is BL16. The third burst length counter 730 and the fourth burst length counter 740 are second group counters which operate for another 1 cycle period using the output of the second burst length counter 720, so that the first and second group counters operate for a 2 cycle period that is two times longer than the 1 cycle period when a burst length magnitude is BL32.

The output of the second burst length counter 720 has the magnitude of the burst length BL16, and the output of the fourth burst length counter 740 has the magnitude of the burst length BL32. Then, the output of the fourth burst length counter 740 has a burst length two times longer than the output of the second burst length counter 720.

In the burst length BL16 mode, the burst stop signal BEND is activated and outputted according to the output of the second burst length counter 720 after one count cycle. In the burst length BL32 mode, the burst stop signal BEND is activated and outputted according to the output of the fourth burst length counter 740 after two count cycles.

According to embodiments of the present disclosure, a burst length may be selectively controlled in an on-the-fly mode according to a write command or a read command under low power supply voltage circumstances.

Also, according to embodiments of the present disclosure, an auto precharge mode may be provided when in a mode having a selectable burst length.

While certain embodiments have been described above, it will be understood to those skilled in the art that the embodiments described are illustrative, and embodiments of the present disclosure are not limited thereto. Rather, the burst length control circuit and the semiconductor device including the same described herein should only be limited in light of the claims that follow when taken in conjunction with the above description and accompanying drawings.

What is claimed is:

1. A burst length control circuit comprising:
    a burst length input circuit configured to output a mode register burst length signal including burst length information, an on-the-fly signal, and a burst length on-the-fly signal including on-the-fly information, in correspondence to command addresses and an internal command address;
    a burst length generator circuit configured to output a burst length signal according to the mode register burst length signal and the burst length on-the-fly signal;
    a burst length adjuster configured to produce a write burst length control signal by delaying the burst length signal by a write latency time;
    a selection circuit configured to produce a burst length control signal by selecting, according to a write read command signal and the on-the-fly signal, any one of the burst length signal and the write burst length control signal; and
    a burst stop counter configured to produce a burst stop signal by counting the burst length control signal according to an internal write command signal and an internal read command signal.

2. The burst length control circuit according to claim 1, wherein the burst length input circuit comprising:
    a command decoder configured to decode the command address and output the mode register burst length signal and the on-the-fly signal; and
    an on-the-fly signal generation circuit configured to output the burst length on-the-fly signal according to a write command signal, a read command signal, and the internal command address.

3. The burst length control circuit according to claim 1, wherein the burst length adjuster comprises:
    a replica latency control circuit configured to receive the burst length signal and delay the burst length signal by the write latency time; and
    a replica burst length counter configured to count an output of the replica latency control circuit for a corresponding burst length, and output the write burst length control signal.

4. The burst length control circuit according to claim 1, wherein the selection circuit selects the burst length signal when the write read command signal includes a low level, and selects the write burst length control signal according to the on-the-fly signal when the write read command signal includes a high level.

5. The burst length control circuit according to claim 1, wherein the selection circuit selects the write burst length control signal in a write mode and selects the burst length signal in a read mode.

6. The burst length control circuit according to claim 1, wherein the burst stop counter comprises:
    a first group counter configured to operate when the burst length control signal includes a first burst length magnitude;
    a second group counter configured to operate when the burst length control signal includes a second burst length magnitude; and
    a burst stop signal generating section configured to produce the burst stop signal by selecting any one of an output of the first group counter and an output of the second group counter.

7. The burst length control circuit according to claim 1, further comprising:
    a precharge control circuit configured to control an auto precharge operation according to the burst stop signal;
    a write control circuit configured to control a write operation according to the burst stop signal; and
    a read control circuit configured to control a read operation according to the burst stop signal.

8. The burst length control circuit according to claim 7, wherein the write control circuit outputs a write signal including column address strobe information for write data of a corresponding burst length, according to the burst stop signal.

9. The burst length control circuit according to claim 7, wherein the read control circuit outputs a read signal including column address strobe pulse information for read data of a corresponding burst length, according to the burst stop signal.

10. A semiconductor device comprising:
    a burst length control circuit configured to:
        generate a burst length signal including burst information according to a mode register burst length signal including burst length information, an on-the-fly signal, and a burst length on-the-fly signal including on-the-fly information, output a write burst length control signal generated by delaying the burst length signal according to a write latency, and when in an on-the-fly mode, output a burst stop signal by selecting any one of the burst length signal and the write burst length control signal according to a write read command signal;

a precharge control circuit configured to control an auto precharge operation according to the burst stop signal;

a write control circuit configured to control a write operation according to the burst stop signal;

a read control circuit configured to control a read operation according to the burst stop signal; and a bank configured to operate according to a burst length selected based on outputs of the precharge control circuit, the write control circuit, and the read control circuit.

11. The semiconductor device according to claim 10, wherein the burst length control circuit comprises:

a burst length input circuit configured to output the mode register burst length signal, the on-the-fly signal, and the burst length on-the-fly signal in correspondence to command addresses and an internal command address;

a burst length generator circuit configured to output the burst length signal according to the mode register burst length signal, the on-the-fly signal, and the burst length on-the-fly signal;

a burst length adjuster configured to delay the burst length signal by a write latency time of a write mode to produce the write burst length control signal;

a selection circuit configured to select any one of the burst length signal and the write burst length control signal according to the write read command signal and the on-the-fly signal to produce a burst length control signal; and a burst stop counter configured to count the burst length control signal according to an internal write command signal and an internal read command signal, and output the burst stop signal.

12. The semiconductor device according to claim 11, further comprising a burst length input circuit, wherein the burst length input circuit comprises:

a command decoder configured to decode the command address and output the mode register burst length signal and the on-the-fly signal; and an on-the-fly signal generation circuit configured to output the burst length on-the-fly signal according to a write command signal, a read command signal, and the internal command address.

13. The semiconductor device according to claim 11, wherein the burst length adjuster comprises:

a replica latency control circuit configured to delay the burst length signal according to the write latency; and a replica burst length counter configured to count an output of the replica latency control circuit for a corresponding burst length, and produce the write burst length control signal.

14. The semiconductor device according to claim 11, wherein the selection circuit selects the burst length signal when the write read command signal includes a low level, and selects the write burst length control signal according to the on-the-fly signal when the write read command signal includes a high level.

15. The semiconductor device according to claim 11, wherein the selection circuit selects the write burst length control signal in the write mode and selects the burst length signal in a read mode.

16. The semiconductor device according to claim 11, wherein the burst stop counter comprises:

a first group counter configured to operate when the burst length control signal includes a first burst length magnitude;

a second group counter configured to operate when the burst length control signal includes a second burst length magnitude; and a burst stop signal generating section configured to select any one of an output of the first group counter and an output of the second group counter, and output the burst stop signal.

17. The semiconductor device according to claim 10, wherein the write control circuit outputs a write signal including column address strobe pulse information for write data of a corresponding burst length, according to the burst stop signal.

18. The semiconductor device according to claim 10, wherein the read control circuit outputs a read signal including column address strobe pulse information for read data of a corresponding burst length, according to the burst stop signal.

* * * * *